(12) United States Patent
Endo et al.

(10) Patent No.: US 8,686,567 B2
(45) Date of Patent: Apr. 1, 2014

(54) SEMICONDUCTOR DEVICE HAVING PLURAL WIRING LAYERS

(76) Inventors: Kiyotaka Endo, Tokyo (JP); Kazuteru Ishizuka, Tokyo (JP); Hiroki Fujisawa, Tokyo (JP)

( * ) Notice: Subject to any disclaimer, the term of this patent is extended or adjusted under 35 U.S.C. 154(b) by 299 days.

(21) Appl. No.: 13/298,995

(22) Filed: Nov. 17, 2011

(65) Prior Publication Data

US 2012/0126422 A1    May 24, 2012

(30) Foreign Application Priority Data

Nov. 18, 2010  (JP) .................................. 2010-258144

(51) Int. Cl.
*H01L 23/52* (2006.01)
*H01L 23/48* (2006.01)
*H01L 29/40* (2006.01)

(52) U.S. Cl.
USPC ..... 257/774; 257/776; 257/691; 257/E23.011

(58) Field of Classification Search
USPC ........................... 257/774, 776, 691, E23.011
See application file for complete search history.

(56) References Cited

U.S. PATENT DOCUMENTS

| | | | |
|---|---|---|---|
| 6,483,714 B1 * | 11/2002 | Kabumoto et al. | 361/760 |
| 2007/0278546 A1 * | 12/2007 | Olligs et al. | 257/296 |
| 2008/0099828 A1 * | 5/2008 | Heinrichsdorff et al. | 257/324 |
| 2010/0254191 A1 * | 10/2010 | Son et al. | 365/185.05 |

FOREIGN PATENT DOCUMENTS

| | | |
|---|---|---|
| JP | 2001-127162 | 5/2001 |
| JP | 2005-302756 | 10/2005 |
| JP | 2005-535118 | 11/2005 |
| JP | 2006-108406 | 4/2006 |

* cited by examiner

*Primary Examiner* — Luan C Thai

(57) ABSTRACT

A semiconductor device includes a lower wiring layer, having signal lines and power supply lines extending in a Y-direction; an upper wiring layer having signal lines and power supply lines extending in an X-direction; via conductors provided in first overlap regions where corresponding signal lines overlap each other; and via conductors provided in second overlap regions where corresponding power supply lines overlap each other. The width in the X-direction of the first regions is wider than the widths in the X-direction of the second regions. Therefore, in the first regions, a plurality of via conductors can be provided. Moreover, the power supply lines are divided in the Y-direction to avoid interference with the first regions. On a plurality of lower-layer lines, two vias are placed at a minimum pitch containing one via.

20 Claims, 14 Drawing Sheets and a layout method and design program thereof, and particu-# SEMICONDUCTOR DEVICE HAVING PLURAL WIRING LAYERS

BACKGROUND OF THE INVENTION

1. Field of the Invention

The present invention relates to a semiconductor device and a layout method and design program thereof, and particularly to a semiconductor device, in which signal lines and power supply lines each formed on different wiring layers are connected by via conductors, and a layout method and design program thereof.

2. Description of Related Art

A plurality of wiring layers are provided in a semiconductor device. A large number of signal lines and power supply lines are formed on each wiring layer. Each of the signal lines and power supply lines provided on different wiring layers are connected by via conductors provided so as to pass through interlayer insulating films located between the wiring layers (See Japanese PCT National Publication No. 2005-535118, Japanese Patent Application Laid-open No. 2005-302756, Japanese Patent Application Laid-open No. 2006-108406, and Japanese Patent Application Laid-open No. 2001-127162). For example, Japanese PCT National Publication No. 2005-535118 discloses a wiring layer on which a plurality of conductive lines extend in an X-direction, and another wiring layer on which a plurality of conductive lines extend in a Y-direction. On each wiring layer, signal lines and power supply lines are alternately disposed. According to the layout described above, the power supply lines are provided so as to form a meshed pattern. Therefore, the power supply lines having the meshed pattern function as a shield for the signal lines. The width of the signal lines and the power supply line is set so as to cover a via conductor. Therefore, the line-and-space L/S or first wiring pitch of the conductive lines where the via conductor exists takes a larger value than the line-and-space L/S or second wiring pitch of the conductive line where the via conductor does not exist. This is because a certain size of margin is necessary between an edge of a via conductor and an edge of a conductive line to keep the via conductor from falling off the conductive line.

However, in the semiconductor device disclosed in Japanese PCT National Publication No. 2005-535118, a via conductor connecting signal lines together, and a via conductor connecting power supply lines with a shielding function together, are formed under the same conditions. Therefore, if each via conductor is so designed as to have a minimum diameter that can be formed, defects may appear in the via conductors, resulting in a higher rate of bad connections in the signal lines. On one hand, if the via conductors are so designed as to be larger in diameter to prevent such bad connections, it is inevitable that both wiring pitches, i.e. the pitch of a lower wiring layer and the wiring pitch of an upper layer, are further increased, resulting in an increase in the area of a semiconductor chip. On the other hand, if two via conductors with a minimum diameter are disposed per a connecting point, it is inevitable, as in the above case, that the wiring pitches are further increased, resulting in an increase in the area of a semiconductor chip. That is, achieving the shielding function, as well as preventing the electrical disconnection or higher resistance of signal lines due to poor contact or higher resistance of via conductors, leads to an increase in an occupied area for a plurality of wiring pattern regions.

SUMMARY

In one embodiment, there is provided a semiconductor device that includes: a plurality of first conductive lines extending in a first direction formed on a first layer; a plurality of second conductive lines extending in a second direction different from the first direction formed on a second layer provided above the first layer; and a plurality of via conductors each connecting one of the first conductive lines to an associated one of the second conductive lines, the via conductors being provided on a third layer provided between the first and second layers, wherein each of the via conductors has a circle-shaped or an ellipse-shaped having larger in area than the via conductor of the circle-shaped, the via conductors of the ellipse-shaped having a major axis extending in the second direction, the first conductive lines include a plurality of first signal lines and a plurality of first power supply lines so as to be adjacent to each other, the second conductive lines include a plurality of second signal lines and a plurality of second power supply lines so as to be adjacent to each other, the third layer includes a plurality of first regions, each of the first regions being provided between one of the first signal lines and an associated one of the second signal lines, at least two via conductors of the circle-shaped laid out in the second direction or at least one via conductor of the ellipse-shaped are disposed at each of the first regions, each of the first signal lines has a second region that is overlapped with an associated one of the first regions, at least one of the first power supply lines is divided in the first direction so as not to be connected to an adjacent one of the second regions, each of the second signal lines has a third region that is overlapped with an associated one of the first regions, and each of the first power supply lines is connected to an associated one or more of the second power supply lines by at least one of the via conductors.

In another embodiment, there is provided a semiconductor device that includes: a first wiring layer on which a plurality of first signal lines and a plurality of first power supply lines extending in a first direction are provided; a second wiring layer on which a plurality of second signal lines and a plurality of second power supply lines extending in a second direction crossing the first direction are provided; an insulating layer provided between the first and second wiring layers; a plurality of first via conductors penetrating through the insulating layer in first regions, each of the first signal lines and an associated one or more of the second signal lines being connected to each other by at least one of the first via conductors; and a plurality of second via conductors penetrating through the insulating layer in second regions, each of the first power supply lines and an associated one or more of the second power supply lines being connected to each other by at least one of the second via conductors, wherein a width of the first signal lines in a second direction at the first regions is larger than a width of the first power supply lines in the second direction at the second regions, and the first power supply line is divided in the first direction to avoid interference with the first signal lines in the first regions.

In one embodiment, there is provided a layout method of a semiconductor device that includes: defining a plurality of first signal lines each extending in a first direction on a first wiring layer; defining a plurality of second signal lines each extending in a second direction that crosses the first direction on a second wiring layer; specifying a plurality of first regions in which the first and second signal lines to be connected together overlap each other in planar view; expanding a width of the first signal lines in the second direction in the first regions; defining a first via conductor in each of the expanded first regions; defining a plurality of first power supply lines extending in the first direction on the first wiring layer in such a way that interference with the first signal lines does not occur in the first regions; and defining a plurality of second power supply lines each extending in the second direction on the second wiring layer.

In one embodiment, there is provided a design program of a semiconductor device that causes a computer to execute: a first function of defining a plurality of first signal lines each extending in a first direction on a first wiring layer; a second function of defining a plurality of second signal lines each extending in a second direction that crosses the first direction on a second wiring layer; a third function of specifying a plurality of first regions in which the first and second signal lines to be connected together overlap each other in planar view; a fourth function of expanding a width of the first signal lines in the second direction in the first region; a fifth function of defining a first via conductor in each of the expanded first regions; a sixth function of defining a plurality of first power supply lines each extending in the first direction on the first wiring layer in such a way that interference with the first signal lines does not occur in the first region; and a seventh function of defining a plurality of second power supply lines each extending in the second direction on the second wiring layer.

DETAILED DESCRIPTION OF PREFERRED EMBODIMENTS

Figure 1A:
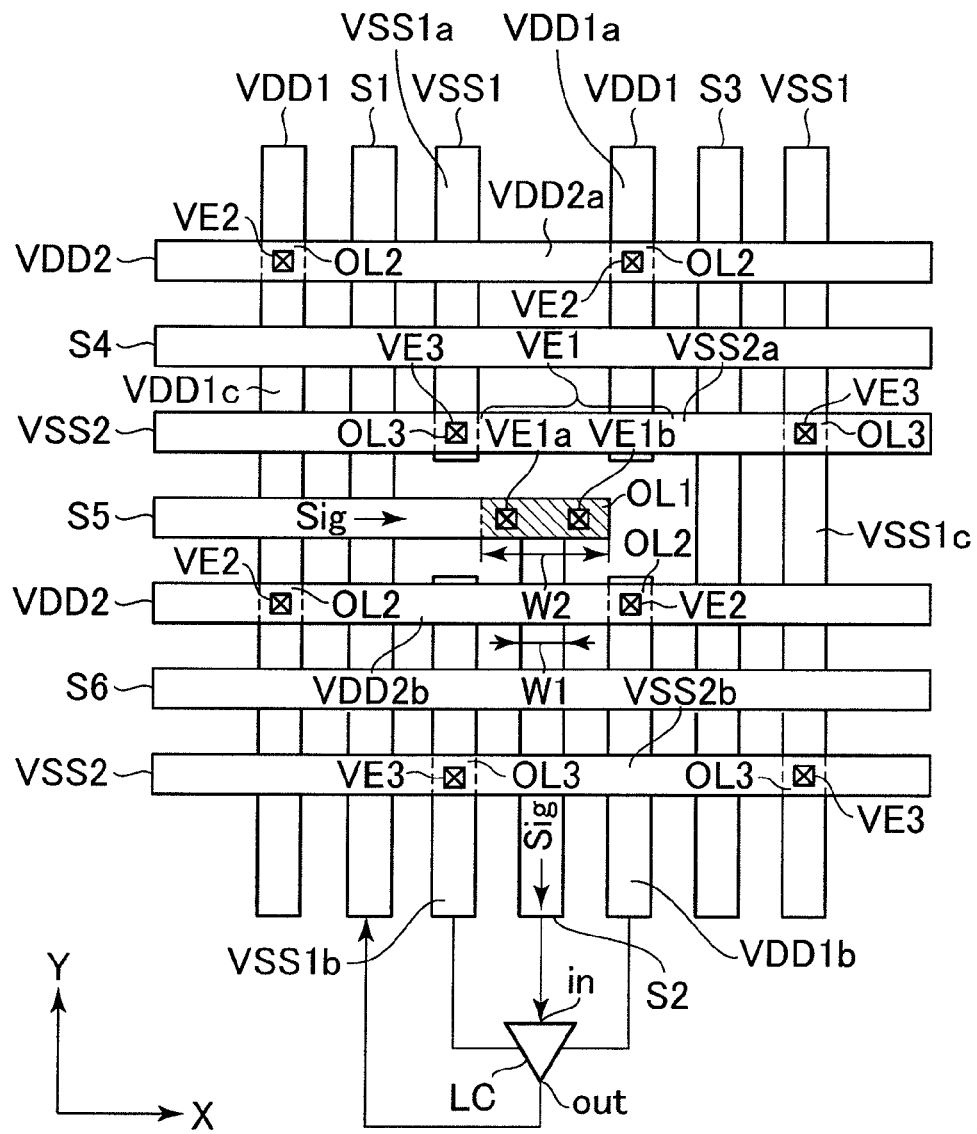
FIG. 1A is a block diagram indicative of the principles of the present invention.

A representative example of the technical concept of the present invention for solving the events will be described below. It will be understood that what is claimed by the present invention is not limited to such a technical concept and is set forth in the claims of the present invention. That is, a technical concept of the present invention is that: a lower wiring layer on which signal lines and power supply lines are alternately provided so as to extend in a Y-direction, and an upper wiring layer on which signal lines and power supply lines are alternately provided so as to extend in a X-direction, are provided; a via conductor having a first area for a signal line is provided in a first overlap region where a signal line of the lower wiring layer and a signal line of the upper wiring layer overlap each other in planar view; a via conductor having a second area, which is smaller than the first area, for a power supply line is provided in a second overlap region where a power supply line of the lower wiring layer and a power supply line of the upper wiring layer overlap each other in planar view; in the first overlap region, the width of a signal line of the lower wiring layer extended in Y-direction is increased in the X-direction; and in the region adjacent to the first overlap region, a power supply line of the lower wiring layer extended in Y-direction is divided in the Y-direction. According to the above configuration, even on the lower wiring layer, while a line associated with a signal line of the present application contains a via conductor having the second area, the line-and-space L/S (first wiring pitch) of a line with one via conductor having the first area is maintained, and the reliability of a via conductor for a signal line is improved. As a result, signal lines and power supply lines can be laid out on the lower wiring layer at the first wiring pitch. Moreover, since power supply lines of the lower wiring layer associated with the first overlap region is divided, via conductors disposed in the first overlap regions can be expanded to support, for example, double the line-and-space L/S in the first wiring pitch as a reference, lowering the possibility that a via conductor for a signal line will be electrically disconnected (or have higher resistance). According to another method of disposing via conductors, two via conductors each having the first area are disposed on the signal line. On the other hand, as for power supply lines divided in the Y-direction, electric potential is supplied via a plurality of via conductors each having the second area for a large number of power supply lines provided in any region other than the first overlap region. Therefore, from a macroscopic point of view, the division does not effectively decrease a shielding effect. Moreover, the reliability of a via conductor for a power supply line is lower than the reliability of a via conductor for a signal line. However, a large number of via conductors for power supply lines are provided for one type of power supply potential. Therefore, even if some via conductors become badly connected (or have higher resistance), the trouble has little effect.

Referring now to FIG. 1, semiconductor device of the present invention includes a lower wiring layer and an upper wiring layer. A plurality of signal lines S1 to S3 and power supply lines VDD1 and VSS1 which are alternately disposed between the signal lines S1 to S3 are formed at a first wiring pitch on the lower wiring layer. A plurality of signal lines S4 to S6 and power supply lines VDD2 and VSS2 which are disposed on both sides of each of the signal lines S4 to S6 are formed on the upper wiring layer. The first wiring pitch represents the line-and-space L/S of a line with a formed via conductor having a second area. The wiring pitch of the upper wiring layer may be the first wiring pitch, or a pitch larger than the first wiring pitch. Incidentally, in the present specification, a "pitch" means the line-and-space of a line. The "line-and-space" represents the width of the line and a space. A "via conductor" may be simply referred to as a "via," "contact," or "via conductive material." A "signal line" may be referred to as "signal line width" or simply as a "line." A "power supply line" may be referred to as "power supply line width" or simply as a "line." A "wiring pitch" may be simply referred to as a "pitch." Moreover, as opposed to the pitch of a line not containing a via, the pitch of a line containing the smallest-size via may be referred to as "first pitch," and the pitch of a line containing a via larger than the smallest-size via may be referred to as "second pitch." The "smallest-size via" may be referred to as a "via having a second area." The "large-size via" may be referred to as a "via having a first area." In a region where a plurality of lines extend, the pitch of a line not containing a via and the first and second pitches are relative sizes to each other in pitch. That is, the pitches described above do not necessarily represent a so-called minimum exposure size associated with production of the semiconductor device.

In FIG. 1A, as for a plurality of first lines provided on the lower wiring layer, the signal lines S1 to S3 and the power supply lines VDD1 and VSS1 extend in the Y-direction. As for a plurality of second lines provided on the upper wiring layer, the signal lines S4 to S6 and the power supply lines VDD2 and VSS2 extend in the X-direction. The power supply lines VDD1 and VDD2 supply high-potential power supply potential VDD. The power supply lines VSS1 and VSS2 supply low-potential ground potential VSS. According to the above layout, the power supply lines are in a meshed pattern. Therefore, a plurality of power supply lines function as a shield for each of the signal lines S1 to S6. A plurality of first lines are laid out at a first pitch of a first line-and-space, which is the width of a line containing a via conductor and the space of the first lines. A plurality of second lines are also laid out at the first pitch. The reason is, for example, that even if two via conductors are arranged in the X-direction, the via conductors have no effect on the pitch because of an offset by decoupling an line adjacent to a region containing two via conductors. Because of a process (accuracy of aligning seams), the wiring pitch of the upper layer may be looser than that of the lower layer. That is, all that is required is that some second lines are laid out at least at a second pitch that is greater than or equal to a second line-and-space, which is the width of a line containing the two via conductor and the space of the line.

In the example shown in FIG. 1A, a signal Sig flowing through the signal line S2 is supplied to an input node in of a logic circuit LC. The logic circuit LC is made up of a CMOS inverter and the like, including a NMOS transistor and PMOS transistor operated by voltage between the power supply potential VDD and the ground potential VSS; an output node out thereof is connected to a signal line S1. The power supply potential VDD is supplied to the logic circuit LC via the power supply lines VDD1 and VDD2. The ground voltage VSS is supplied to the logic circuit LC via the power supply lines VSS1 and VSS2.

The signal Sig is supplied to the signal line S2 via the signal line S5. In an overlap region OL1 where the signal line S2 extending in the Y-direction and the signal line S5, extending in the X-direction overlap each other in planar view, a via conductor VE1 is provided. Thus, the signal lines S2 and S5 are electrically connected. According to the present invention, a region where a signal line of the lower wiring layer and a signal line of the upper wiring layer cross each other may be referred to as a "first region"; a region corresponding to the overlap region OL1 in a signal line of the lower wiring layer may be referred to as a "second region"; and a region corresponding to the overlap region OL1 in a signal line of the upper wiring layer may be referred to as a "third region."

Figure 1B:
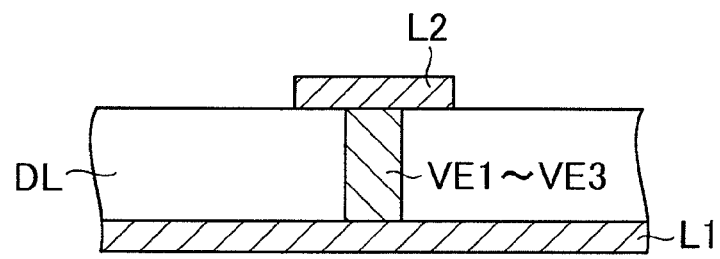
FIG. 1B is a schematic cross-sectional view of VE1 to VE3 as shown in FIG. 1A.

In overlap regions OL2 where the power supply line VDD1 extending in the Y-direction and the power supply line VDD2 extending in the X-direction overlap each other in planar view, via conductors VE2 are provided. Thus, the power supply lines VDD1 and VDD2 are electrically connected. In overlap regions OL3 where the power supply line VSS1 extending in the Y-direction and the power supply line VSS2 extending in the X-direction overlap each other in planar view, via conductors VE3 are provided. Thus, the power supply lines VSS1 and VSS2 are electrically connected. As shown in FIG. 1B, which is a schematic cross-sectional view, the via conductors VE1 to VE3 are so provided as to pass through an insulating layer DL provided between the lower wiring layer L1 and the upper wiring layer L2.

As shown in FIG. 1A, in the overlap region OL1, the width of the signal line S2 in the X-direction is increased. That is, if the X-direction width of the signal line S2 in a region other than the overlap region is represented by W1, and the X-direction width of the signal line S2 in the overlap region by W2:

$$W1 < W2$$

Accordingly, an area where the via conductor VE1 can be formed increases. Therefore, in the example shown in FIG. 1A, two via conductors VE1$a$ and VE1$b$ are disposed side by side in the X-direction in one overlap region OL1, thereby improving the reliability of the via conductors VE1. Meanwhile, in the overlap regions OL2 and OL3, the X-direction widths of the power supply lines VDD1 and VSS1 are not effectively increased. Therefore, what can be done is only to place one via conductor VE2 or VE3 in one overlap region OL2 or OL3. Incidentally, what the above means is not that the X-direction widths of the overlap regions OL2 and OL3 cannot be increased. In terms of designing, the X-direction widths of the overlap regions OL2 and OL3 may be slightly increased as long as the wiring pitch of the lower wiring layer is not affected.

As described above, in the overlap region OL1, the X-direction width of the signal line S2 is increased. Therefore, it is not possible to simply allow the adjacent power supply lines VDD1 and VSS1 to extend in the Y-direction since the first wiring pitch need to be maintained because of the design. Accordingly, the power supply lines VDD1 and VSS1 adjacent to the overlap region OL1 are divided in the Y-direction, thereby keeping the signal line S2 from interfering with the power supply lines VDD1 and VSS1.

The divided power supply lines VDD1 and VSS1 take a roundabout route via power supply lines extending in the X-direction on the upper wiring layer and another power supply line extending in the Y-direction on the lower wiring layer. For example, the divided power supply lines VDD1$a$ and VDD1$b$ are electrically connected via power supply lines VDD2$a$, VDD1$c$ and VDD2$b$ shown in FIG. 1A. Similarly, the divided power supply lines VSS1$a$ and VSS1$b$ are electrically connected via power supply lines VSS2$a$, VSS1$c$ and VSS2$b$.

According to the above configuration, it is possible to ensure the first wiring pitch for the layout on the lower wiring layer and improve the reliability of the via conductors VE1, as well as to ensure the meshed state of the power supply lines.

Preferred embodiments of the present invention will be explained below in detail with reference to the accompanying drawings.

Figure 2:
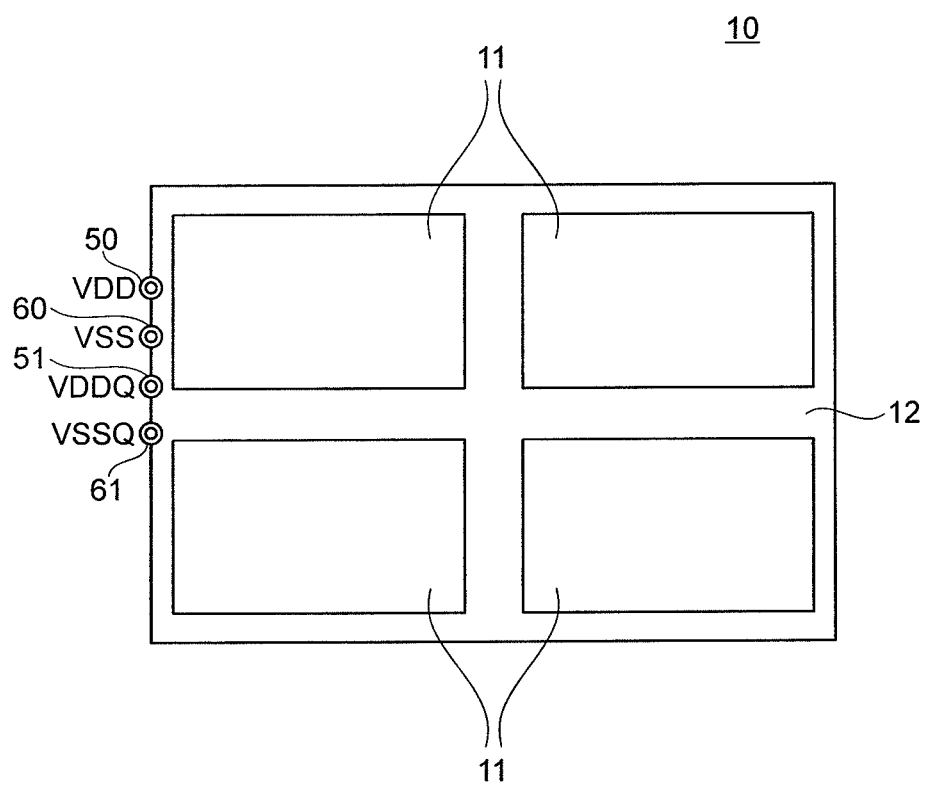
FIG. 2 is a schematic plan view showing indicative of an entire semiconductor device 10 according to an embodiment of the present invention.

Turning to FIG. 2, although not being limited to a specific one, the semiconductor device 10 of the present embodiment is a DRAM (Dynamic Random Access Memory). The semiconductor device 10 includes at least the following terminals as terminals related to a power source: a VDD terminal 50 supplied with high-potential VDD potential; a VSS terminal 60 supplied with low-potential VSS potential; a VDDQ terminal 51 supplied with high-potential VDDQ potential; and a VSSQ terminal 61 supplied with low-potential VSSQ potential. The semiconductor device 10 includes at least the following parts: a cell array region 11 including a large number of memory cells; an interface circuit including an output transistor, which is connected to an external data terminal exchanging information of memory cells with the outside of the semiconductor device and; and a peripheral circuit region 12, including various control circuits, such as a decoder and a counter. To the memory cell array region 11, a peripheral circuit region 12 and the interface circuit, VDD potential and VSS potential are supplied. Moreover, from a VDD terminal, the VDD potential is supplied. An internal power generating circuit included in the semiconductor device generates a predetermined internal potential to supply the internal potential to the memory cell array region 11, the peripheral circuit region 12 and the interface circuit as VDDI potential. To a first logic circuit that includes an inverter that operates at the VDDI potential and other components, VSSI potential is supplied as low potential. The VSSI potential is connected to a VSS terminal. To a second logic circuit that includes an inverter that operates at the VDD potential and other components, VSS potential is supplied as low potential. A plurality of power supply lines that are each related to the VSS potential and the VSSI potential are formed in a plurality of different layout patterns with respect to the VSS terminal in the semiconductor device. The VDDQ potential and the VSSQ potential are supplied to the output transistor. Since a plurality of memory cells are disposed in a regular pattern in the cell array region 11, lines in the cell array region 11 too are laid out in a regular pattern. As a result, the meshed-pattern power supply lines can easily shield the signal lines laid out in a regular pattern. Meanwhile, in the peripheral circuit region 12, the number of times a repeated circuit pattern is small unlike the cell array region 11, is repeated. Therefore, lines in the peripheral circuit region 12 are in a random pattern.

Figure 3:
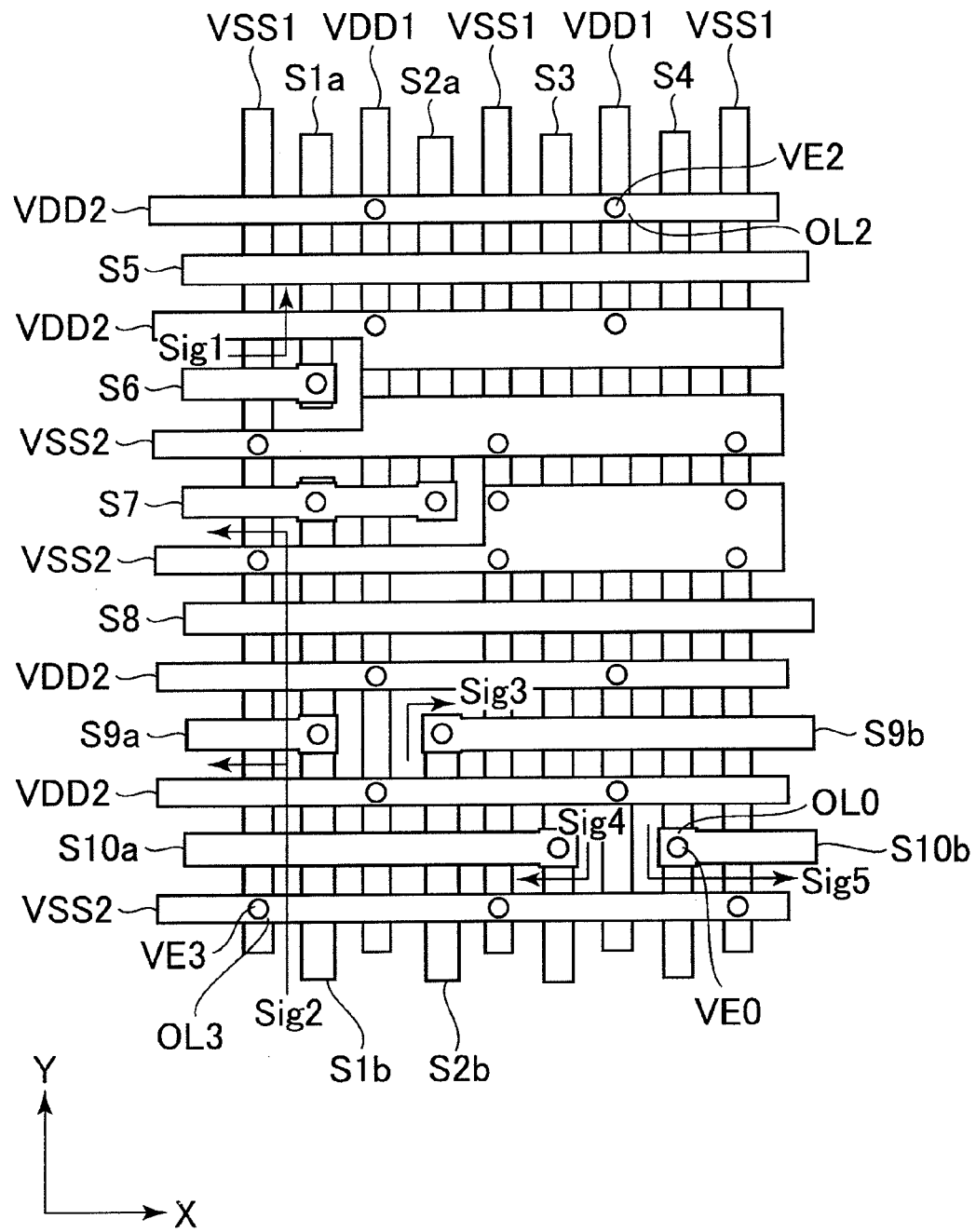
FIG. 3 is a layout chart according to a first comparative example.

FIG. 3 is a layout chart showing an example in which randomly-disposed signal lines are shielded by meshed-pattern power supply lines, and illustrates a first reference example.

In the example shown in FIG. 3, a lower wiring layer and an upper wiring layer are provided: on the lower wiring layer, a plurality of signal lines S1 to S4 and power supply lines VDD1 and VSS1, which are alternately disposed between the signal lines S1 to S4, are formed at a first wiring pitch; and on the upper wiring layer, a plurality of signal lines S5 to S10 and power supply lines VDD2 and VSS2, which are disposed on both sides of the signal lines S5 to S10, are formed at a first wiring pitch. The signal lines S1 to S4 and power supply lines VDD1 and VSS1 on the lower wiring layer extend in a Y-direction. The signal lines S5 to S10 and power supply lines VDD2 and VSS2 on the upper wiring layer extend in an X-direction. On the lower wiring layer, the power supply lines VDD1 and VSS1 are alternately disposed with signal lines between the power supply lines VDD1 and VSS1. On the upper wiring layer, the power supply lines VDD2 and VSS2 are disposed with signal lines between the power supply lines VDD1 and VSS1 in such a way that a set of two power supply lines VDD2 and a set of two power supply lines VSS2 appear alternately.

A portion of the signal line S1 is divided in the Y-direction into signal lines S1a and S1b, which transmit different signals. Similarly, a portion of the signal line S2 is divided in the Y-direction into signal lines S2a and S2b, which transmit different signals. A portion of the signal line S9 is divided in the X-direction into signal lines S9a and S9b, which transmit different signals. Similarly, a portion of the signal line S10 is divided in the X-direction into signal lines S10a and S10b, which transmit different signals.

The signal lines S1a and S6 transmit a signal Sig1. The signal lines S1b, S2a, S7 and S9a transmit a signal Sig2. The signal lines S2b and S9b transmit a signal Sig3. The signal lines S3 and S10a transmit a signal Sig4. The signal lines S4 and S10b transmit a signal Sig5.

The signal lines that transmit the same signal are electrically connected via a via conductor VE0. The via conductor VE0 is disposed in an overlap region OL0 where signal lines of the lower wiring layer and signal lines of the upper wiring layer overlap each other in planar view. Each line provided on the lower wiring layer is laid out at the first wiring pitch. Therefore, the X-direction widths of the signal lines S1 to S4 in the overlap region OL0 are not increased, or even if the widths are increased, the widths are restricted in a way that can ensure the first wiring pitch. The diameter of the via conductor VE0 is a minimum diameter that enables the via conductor VE0 to be formed on an insulating layer DL between the lower wiring layer and the upper wiring layer. In a region shown in FIG. 3, seven via conductors VE0 are provided for wiring. When the via conductors are so designed as to have a minimum diameter that enables the via conductors to be formed on an insulating layer DL, the actual created via conductors are substantially in the shape of a circle.

The power supply lines VDD1 and VDD2 supplied with power supply potential VDD are electrically connected via a via conductor VE2. Similarly, the power supply lines VSS1 and VSS2 supplied with ground potential VSS are electrically connected via a via conductor VE3. The via conductors VE2 and VE3 are disposed in overlap regions OL2 and OL3 where power supply lines of the lower wiring layer and power supply lines of the upper wiring layer overlap each other in planar view. The X-direction widths of the power supply lines VDD1 and VSS1 on the lower wiring layer are not increased in the overlap regions OL2 and OL3, or even if the widths are increased, the widths are restricted in a way that can ensure the first wiring pitch. The diameters of the via conductors VE2 and VE3 are minimum diameters that enable the via conductors VE2 and VE3 to be formed on an insulating layer between the lower wiring layer and the upper wiring layer. In a region shown in FIG. 3, 19 via conductors VE2 and VE3 are provided for supplying power.

In the reference example shown in FIG. 3, the via conductors VE0, VE2 and VE3 with a minimum-diameter are assigned to the signal lines and power supply lines. Therefore, the possibility is high that bad connections will occur in the individual via conductors. On the power supply lines, no problem arises effectively from the bad connections of the via conductors. The reason is that, as shown in FIG. 3, the power supply lines VDD1 and VDD2, or VSS1 and VSS2, are connected at a plurality of locations. Even if some via conductors VE2 and VE3 become badly connected, potential is supplied via other via conductors VE2 and VE3. On the other hand, even if only one via conductor VE0 on a signal line becomes badly connected, a chip as a whole becomes defective due to the defective signal path. Accordingly, in the reference example shown in FIG. 3, there is still room for improvement in terms of the reliability of the product.

Figure 4:
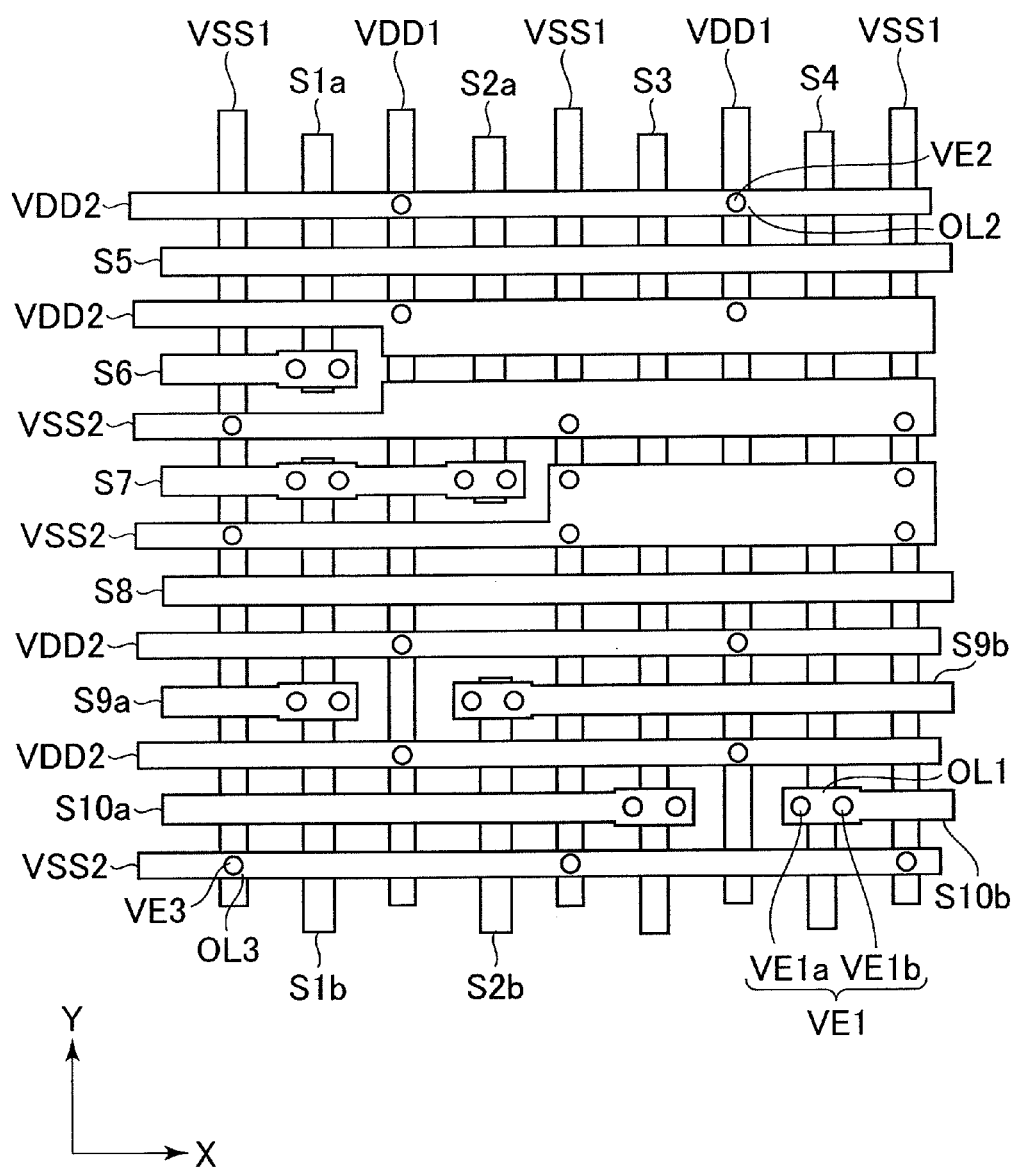
FIG. 4 is a layout chart according to a second comparative example.

FIG. 4 is a layout chart showing an example in which the reliability is improved, and illustrates a second reference example. The objects with no reference symbols are considered to have the same reference symbols as those in FIG. 3, and will not be described.

In the example shown in FIG. 4, in order to improve the reliability, two via conductors VE1a and VE1b are assigned to one overlap region OL1. To make the above structure possible, in the example shown in FIG. 4, the wiring pitch of a lower wiring layer is increased to a third wiring pitch larger than the first wiring pitch. More specifically, in the overlap region OL1, the X-direction width of each of signal lines S1 to S4 is increased. Moreover, in order to keep the overlap region OL1 from interfering with adjacent power supply lines VDD1 and VSS1, the wiring pitch of the lower wiring layer is increased in advance. The structures of the other components are basically the same as those shown in the reference example of FIG. 3.

In the reference example shown in FIG. 4, two via conductors VE1a and VE1b are assigned to the overlap region OL1 of signal lines. Therefore, even if one of the vias is badly connected, the other via ensures the state of electrical connection. As a result, the signal path does not become defective. Accordingly, in the reference example shown in FIG. 4, it is possible to improve the reliability of the product. However, the problem is that as the first wiring pitch is increased to the larger third wiring pitch, the area of a chip increases.

Figure 5:
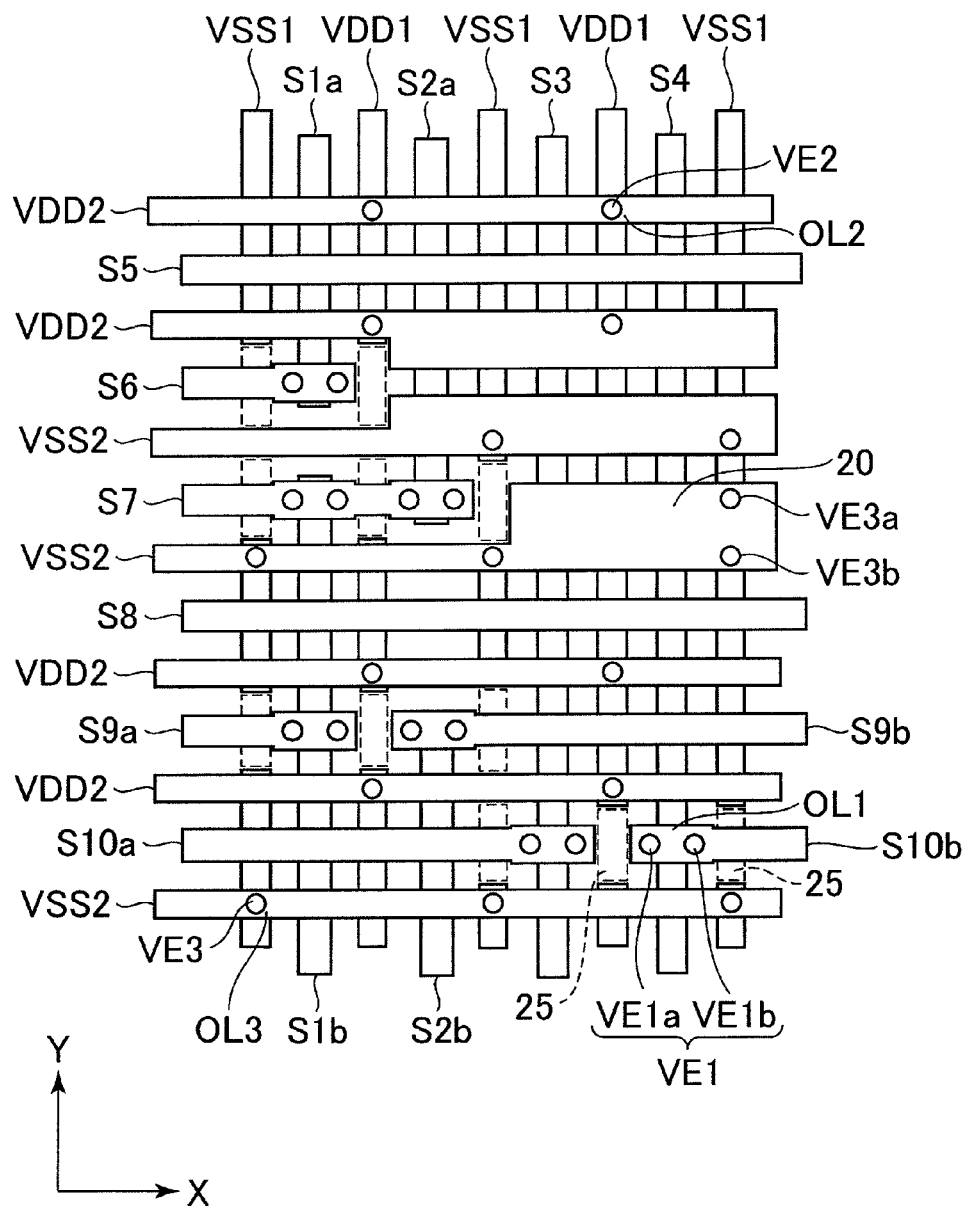
FIG. 5 is a layout chart according to a first preferred embodiment of the present invention.

FIG. 5 is a layout chart according to a first preferred embodiment of the present invention. The objects with no reference symbols are considered to have the same reference symbols as those in FIG. 3, and will not be described.

As shown in FIG. 5, according to the present embodiment, in an overlap region OL1, the X-direction width of each of signal lines S1 to S4 is increased. Accordingly, to one overlap region OL1, two via conductors VE1a and VE1b are assigned. Moreover, in order to keep interference with adjacent power supply lines VDD1 and VSS1 from occurring due to the above configuration, the adjacent power supply lines VDD1 and VSS1 on both sides of the overlap region OL1 are divided in a Y-direction. Regions 25 indicated by dotted lines in FIG. 5 represent divided areas. As a result, it is possible not to increase the wiring pitch of a lower wiring layer, i.e. it is possible to lay out signal lines and power supply lines at a first wiring pitch on the lower wiring layer. It is also possible to improve the reliability of the product as in the reference example shown in FIG. 4.

As described above with reference to FIG. 1A, the divided power supply lines VDD1 and VSS1 take a roundabout route before being connected to a power supply line extending in the X-direct ion on the upper wiring layer via another power supply line extends in the Y-direction on the lower wiring layer and extends in the Y-direction. Therefore, the divided power supply lines VDD1 and VSS1 properly function as power supply lines. Even if a floating portion not connected to any power supply line emerge when the divided sections are close to one side in the Y-direction, no problem arises from a practical point of view. The reason the power supply lines can be divided as described above is that the via conductors for signal lines are sufficiently smaller in number than the via conductors for power supply lines. For example, in the example shown in FIG. 5, the number of via conductors for signal lines is seven, while the number of via conductors for power supply lines is 19; the power supply lines supplied with the same potential are connected at a large number of locations.

Moreover, in an area with no signal line on the upper wiring layer, the Y-direction width of the power supply line VDD2 or VSS2 is increased. For example, in an area 20, the Y-direction width of the power supply line VSS2 is increased, leading to an increase in an area covered with the power supply line. According to the present invention, a conductive pattern in the area 20 may be referred to as "sixth region." As a result, it is possible to improve a shielding effect. In the above area, the Y-direct ion width of the overlap region OL2, in which the power supply lines VDD1 and VDD2 overlap each other in planar view, and the Y-direction width of the overlap region OL3, in which the power supply lines VSS1 and VSS2 overlap each other in planar view, are increased. Therefore, as shown in FIG. 5, at least two via conductors can be assigned to one overlap region OL2 or OL3. In the case of FIG. 5, two via conductors VE3a and VE3b are assigned to an overlap region OL3 of the area 20, which is aimed at enhancing a power source.

As described above, according to the present embodiment, without an increase in the area of the chip, it is possible to improve the reliability of the product.

Figure 6:
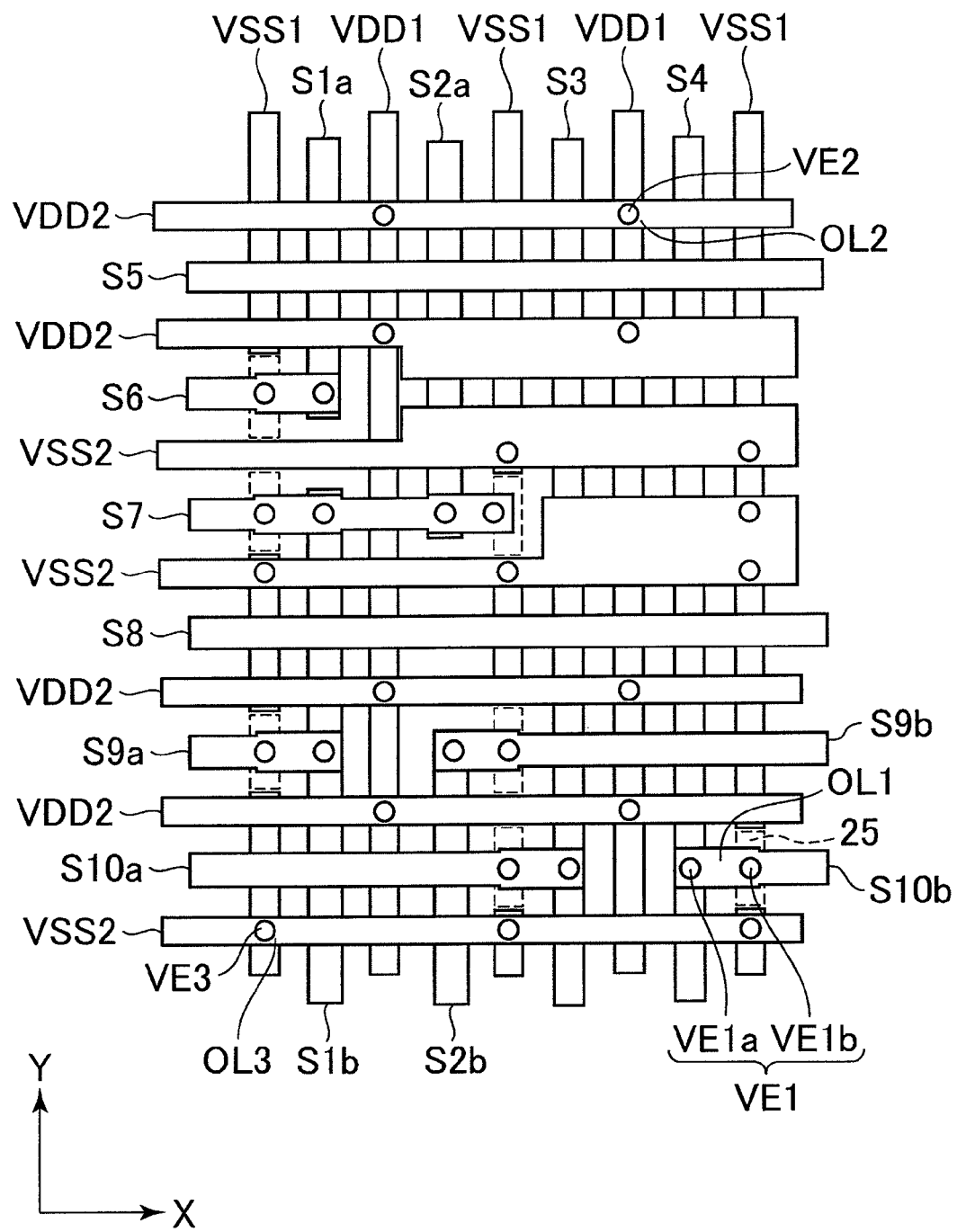
FIG. 6 is a layout chart according to a second preferred embodiment of the present invention.

FIG. 6 is a layout chart according to a second preferred embodiment of the present invention. The objects with no reference symbols are considered to have the same reference symbols as those in FIG. 3, and will not be described.

As shown in FIG. 6, according to the present embodiment, an overlap region OL1 that becomes larger in width in the X-direction is displaced in one direction. More specifically, the X-direction position of the overlap region OL1 is displaced in the X-direction relative to a central axis of a corresponding signal line extending in the Y-direction. As a result, the overlap region OL1 includes one side of a projection is relatively larger in the X-direction relative to the central axis; and a portion of the other side of the projection is relatively smaller in the X-direction relative to the central axis. Therefore, the power supply line adjacent to the larger projection portion needs to be divided in the Y-direction because interference with adjacent power supply lines could occur. Meanwhile, the power supply line adjacent to the smaller projection portion need not be divided in the Y-direction because interference with adjacent power supply lines does not occur. That is, one area 25 is divided with respect to one overlap region OL1. Accordingly, the number of power supply lines divided is reduced by half. Thus, it is possible to increase power-supply intensity (or to prevent the impedance of power supply lines from increasing in terms of the meshed pattern).

Figure 7:
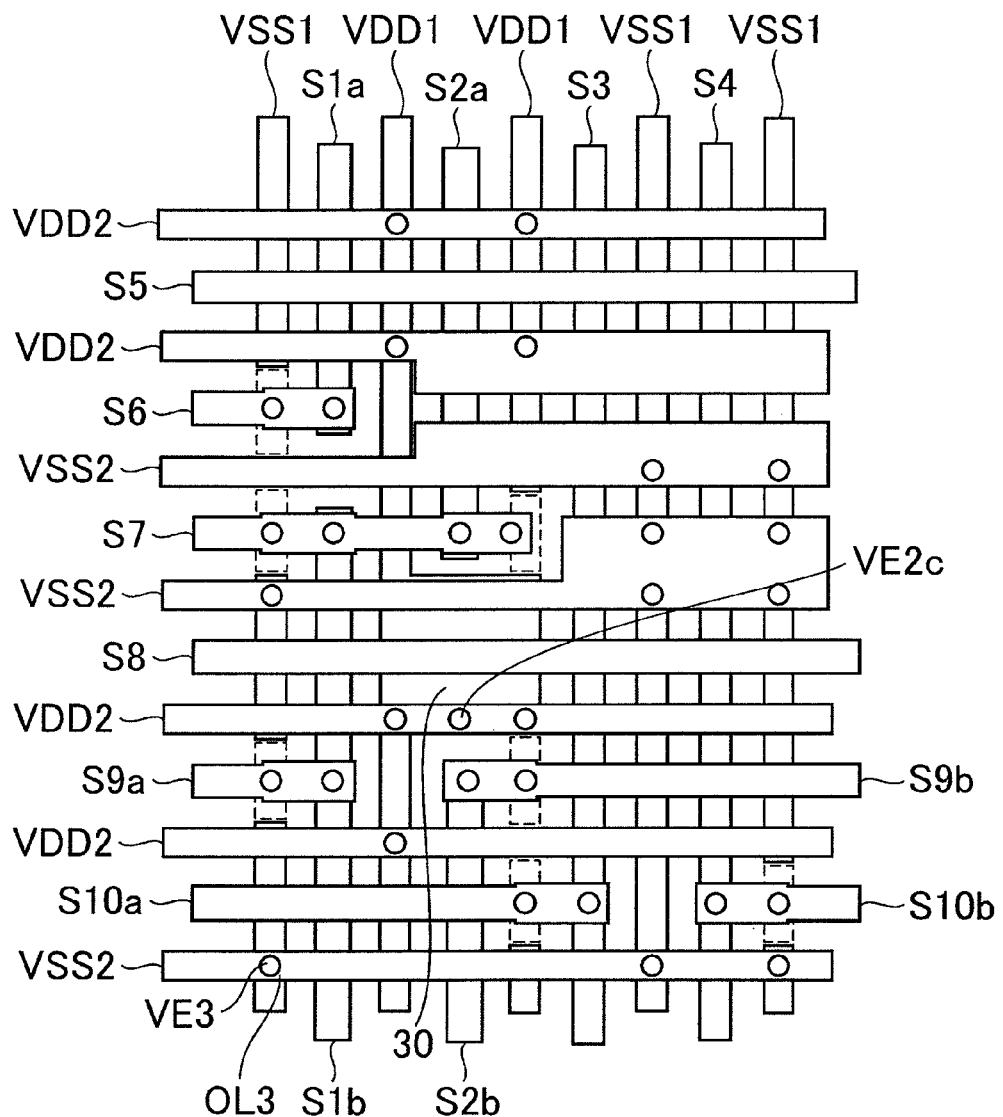
FIG. 7 is a layout chart according to a third preferred embodiment of the present invention.

FIG. 7 is a layout chart according to a third preferred embodiment of the present invention. The objects with no reference symbols are considered to have the same reference symbols as those in FIG. 3, and will not be described.

As shown in FIG. 7, according to the present embodiment, on a lower wiring layer, high-potential-side power supply lines VDD1 and low-potential-side power supply lines VSS1 are disposed with signal lines between power supply lines in such a way that a set of two power supply lines VDD1 and a set of two power supply lines VSS1 appear alternately. One of the two power supply lines VDD1 or two power supply lines VSS1, which are adjacent to each other across a signal line, are defined as those to be cut prior to the other of two power supply lines. For example, an overlap region OL1 of signal lines S1 and S3 is displaced to the left side of the drawing; an overlap region OL1 of signal lines S2 and S4 is displaced to the right side of the drawing. Accordingly, as for the two power supply lines VDD1 or two power supply lines VSS1, the power supply lines on the right side of the drawing are cut; the power supply lines on the left side of the drawing are not cut. Incidentally, high-potential power supply lines VDD1 and low-potential power supply lines VSS1 may be disposed with signal lines between power supply lines in such a way that a set of three power supply lines VDD1 and a set of three power supply lines VDD1 appear alternately. That is, the number of lines described above may be different in each case. The relationship of the order of the high-potential and low-potential power supply lines and signal lines, and the number of the high-potential power supply lines and low-potential power supply lines can be similarly applied to the upper wiring layer even in the third embodiment.

As a result, it is possible to prevent the imbalance in power-supply intensity between the power supply lines VDD1 and VSS1 due to a specific power supply line divided at a large number of locations (or to prevent the impedance of power supply lines from increasing locally in terms of the meshed pattern). Moreover, in an area with no signal line on the lower wiring layer, by increasing the X-direction width of the power supply line VDD2 or VSS2, two adjacent power supply lines VDD1 or two adjacent power supply lines VSS1 can be short-circuited. For example, in an area 30, the X-direction width of the power supply line VDD1 is increased, and the power supply line VDD1 is short-circuited with the adjacent power supply line VDD1. According to the present invention, a conductive pattern provided in the area 30 may be referred to as "fourth region" or "fifth region." As a result an area covered with a power supply line increases. Therefore, it is possible to improve a shielding effect. Moreover, the parasitic capacitance of a power supply line increases, thereby stabilizing the potential of the power supply line at a time when a logic circuit LC operates. FIG. 7 shows only the case where two power supply lines VDD1 are short-circuited with each other. However, two power supply lines VSS1 too are short-circuited via such an area like an area 30. Even in a short-circuited portion in the area 30, providing a via conductor VE2c is aimed at enhancing a power source.

Figure 8:
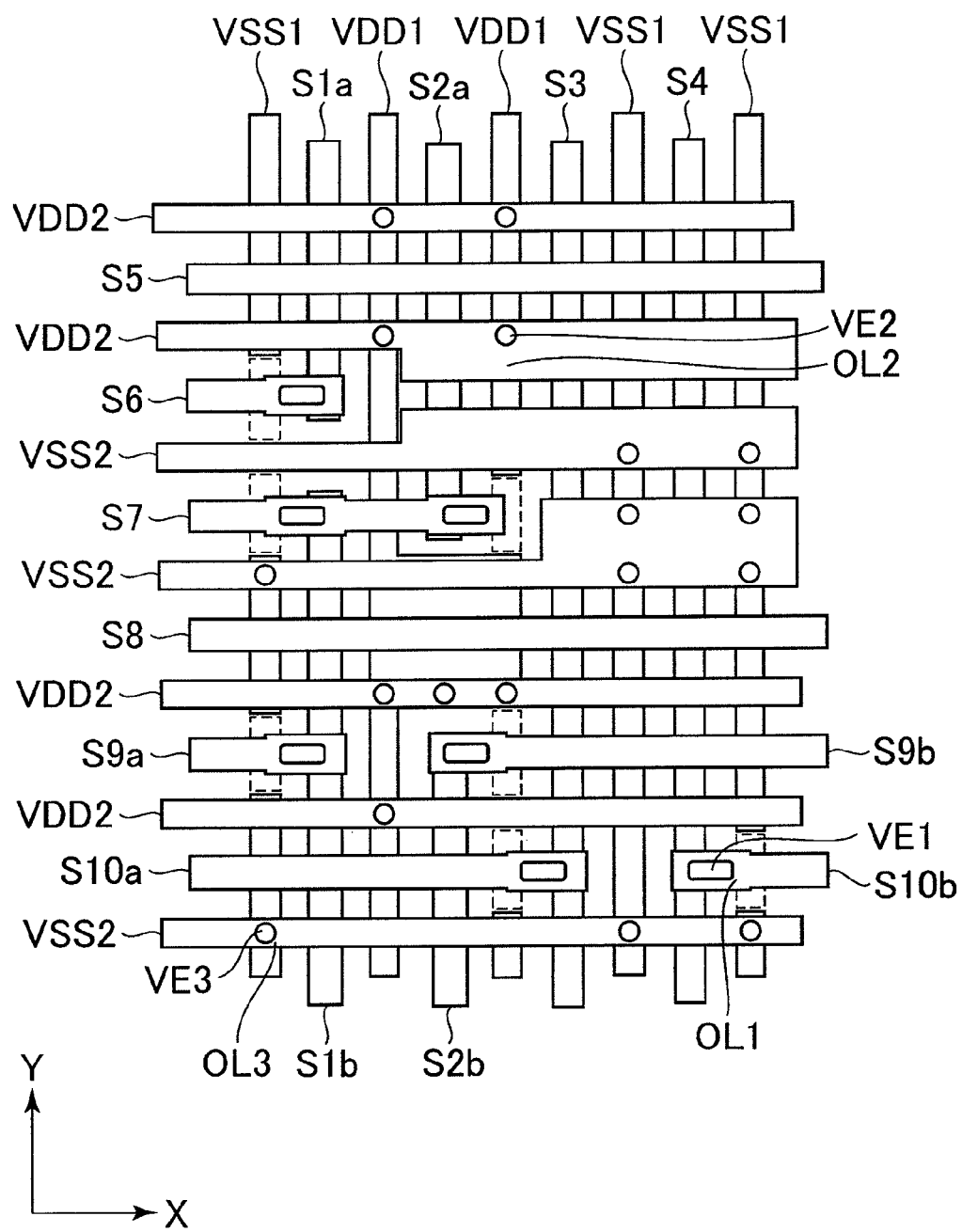
FIG. 8 is a layout chart according to a modification.

Incidentally, in the examples shown in FIGS. 5 to 7, two via conductors VE1a and VE1b are disposed in each overlap region OL1. As shown in FIG. 8, the X-direction diameter of a via conductor VE1 may be designed so as to be larger (longer) than the X-direction diameters of via conductors VE2 and VE3. In this case, because of the larger diameter, the via conductor VE1 rarely lead to bad connection. As shown in FIG. 8, when a rectangular via conductor VE1 is designed, the actual created via conductor VE1 is in the shape of an ellipse. Needless to say, the ellipse is larger in area than a circular via conductor having a minimum diameter.

The following describes a method of designing a semiconductor device according a preferred embodiment of the present invention.

Figure 9:
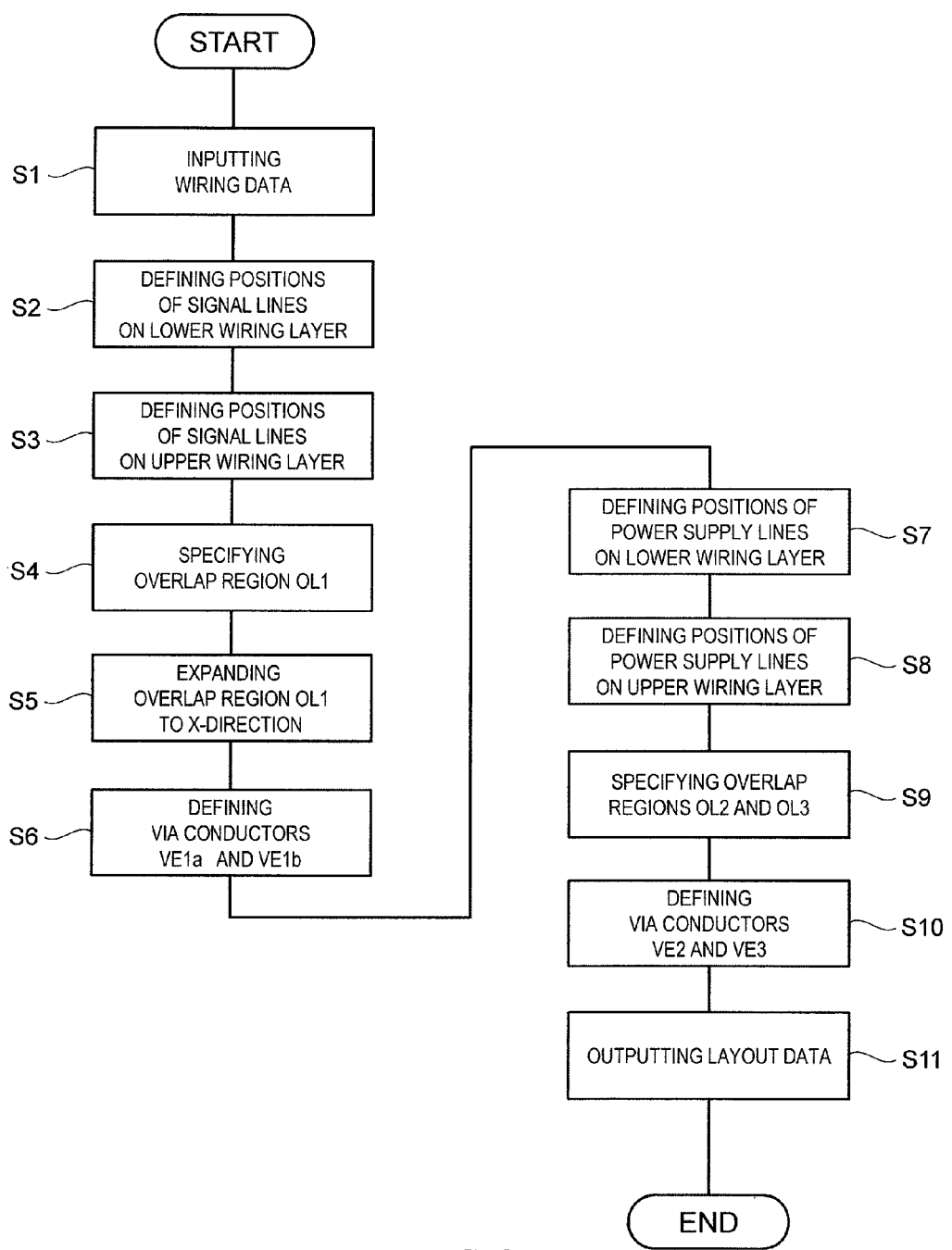
FIG. 9 is a flowchart indicative of a method of designing a semiconductor device according to an embodiment of the present invention.
Figure 10:
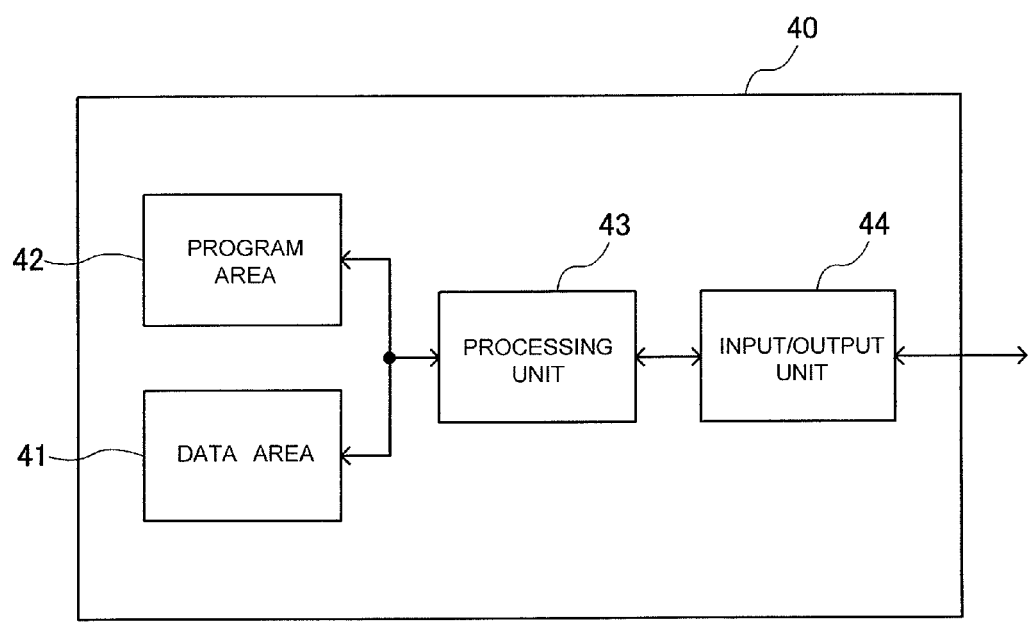
FIG. 10 is a block diagram showing a configuration of a design device 40 performing the method shown in FIG. 9 of a semiconductor device according to an embodiment of the present invention.

The design device 40 shown in FIG. 10 includes a data area 41 to store wiring data and layout data; a program area 42 to store a design program; a processing unit 43 to execute a design program; and an input/output unit 44 to input wiring data and outputs layout data. When a semiconductor device is designed by the design device 40, wiring data of a semiconductor device to be designed is input via the input/output unit 44 as shown in FIG. 9 before being stored in the data area 41 (Step S1).

Then, the processing unit 43 defines the positions of a plurality of signal lines extending in the Y-direction on a lower wiring layer (Step S2), using the design program stored in the program area 42 on the basis of the wiring data; and defines the positions of a plurality of signal lines extending in the X-direction on an upper wiring layer (Step S3). At step S2, the wiring pitch for a plurality of the signal lines is set at double a wiring pitch that can be defined on the lower wiring layer. The reason is to make it possible to dispose one power supply line between two signal lines. More specifically, if a minimum wiring width of a line that can be disposed on the lower wiring layer, is represented by WL, and a wiring interval on the lower wiring layer by WS, the distance A between signal lines adjacent to each other in the X-direction is set to:

$A = WL + 2WS$

At step S3, the wiring pitch for a plurality of the signal lines is set at two or more times as large as a wiring pitch that can be defined on the upper wiring layer. The reason is to make it possible to dispose one power supply line between two signal lines. However, the pitch may be set so as to be greater than double the wiring pitch that can be defined on the upper wiring layer.

Figure 11:
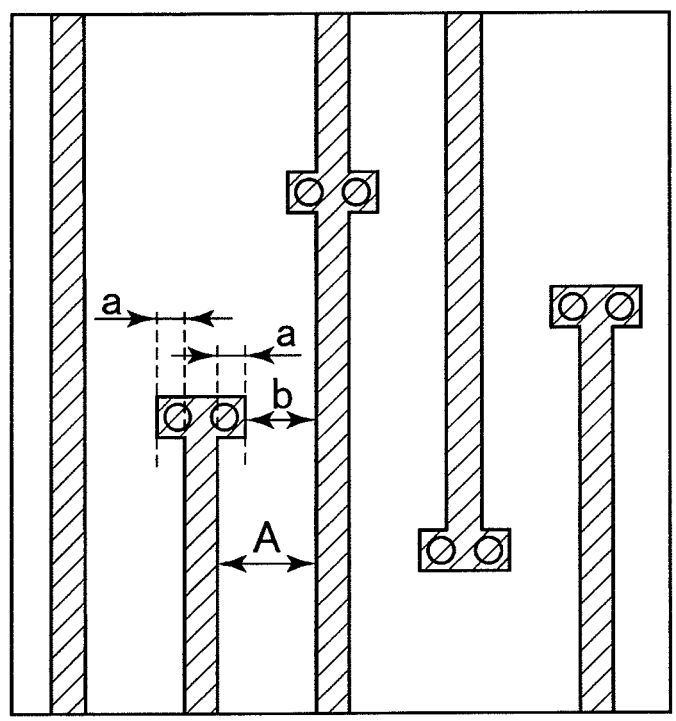
FIG. 11 is a diagram showing layout data after step S6 shown in FIG. 9 is completed.

Then, the processing unit 43 specifies an overlap region OL1, in which among signal lines of the lower wiring layer and signal lines of the upper wiring layer, signal lines to be connected together overlap each other in planar view (Step S4), using the design program stored in the program area 42. Subsequently, the X-direction widths of signal lines of the lower wiring layer in the overlap region OL1 are expanded (Step S5). In the expanded overlap region OL1, a plurality of via conductors VE1a and VE1b are defined (Step S6). The via conductors VE1a and VE1b are respectively so set as to be the same in diameter as via conductors VE2 and VE3 for supplying power. FIG. 11 is a diagram showing layout data after step S6 is completed. If the X-direction width in which two via conductors VE1a and VE1b can be disposed is represented by WV, "a" shown in FIG. 11 is defined as:

$a = WV/2 - WL/2$

Moreover, "b" shown in FIG. 11 is:

$b = WS$

Needless to say, the value of "b" needs to be wider than the minimum wiring interval of the lower wiring layer.

Figure 12:
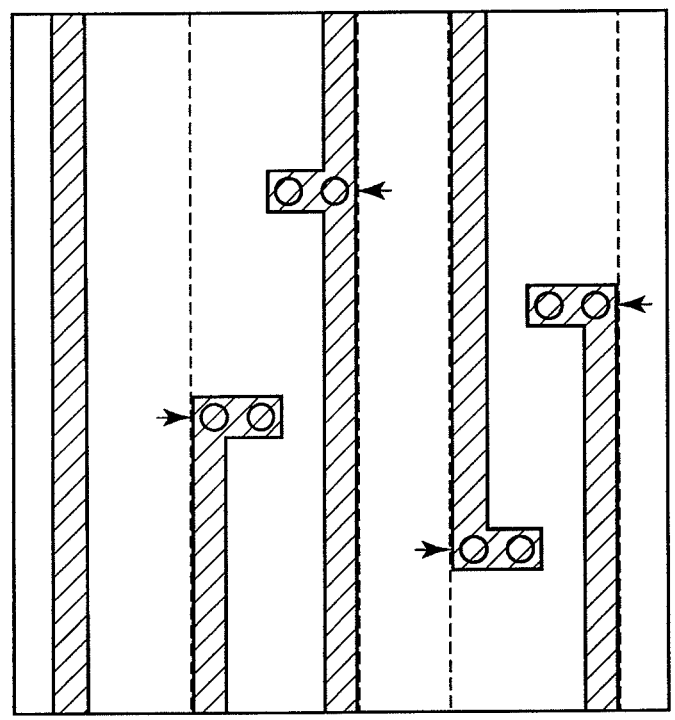
FIG. 12 is a diagram indicative of layout data after an offset process is performed.

At step S5, as described above with reference to FIGS. 6 and 7, it is preferred that the X-direction position of the overlap region OL1 be displaced relative to a central axis in the X-direction about a corresponding signal line extending in the Y-direction. FIG. 12 is a diagram showing layout data after an offset process is performed, and corresponds to an example illustrated above with reference to FIG. 7. Accordingly, the offset directions of adjacent portions face opposite directions. Incidentally, instead of defining a plurality of via conductors VE1a and VE1b in the overlap region OL1, the X-direction diameter of a via conductor VE1 may be defined as being larger than the X-direction diameters of via conductors VE2 and VE3 as described above with reference to FIG. 8.

Figure 13:
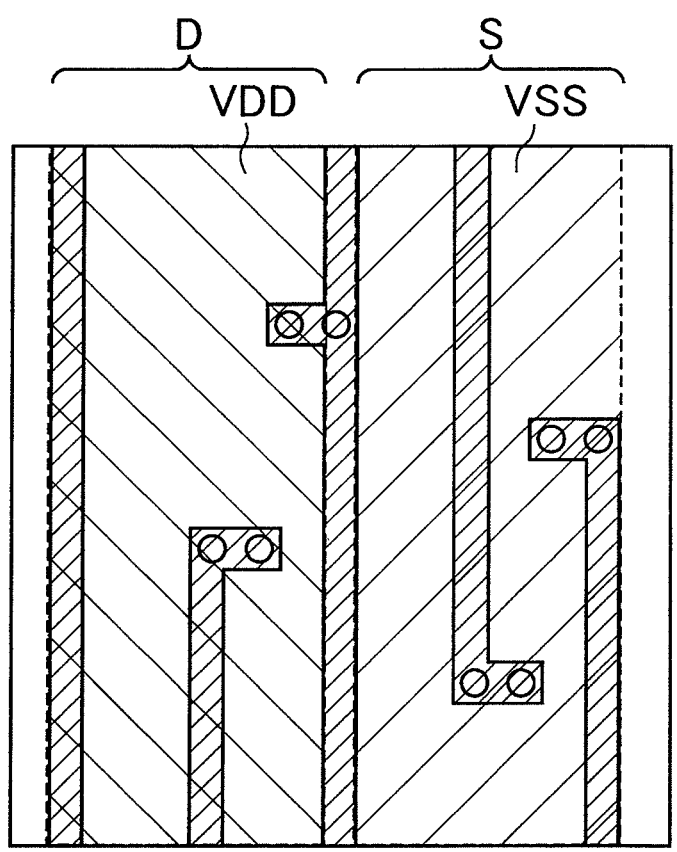
FIG. 13 is a diagram indicative of layout data when power supply lines VDD1 and VSS1 are defined in the regions D and S, respectively.
Figure 14:
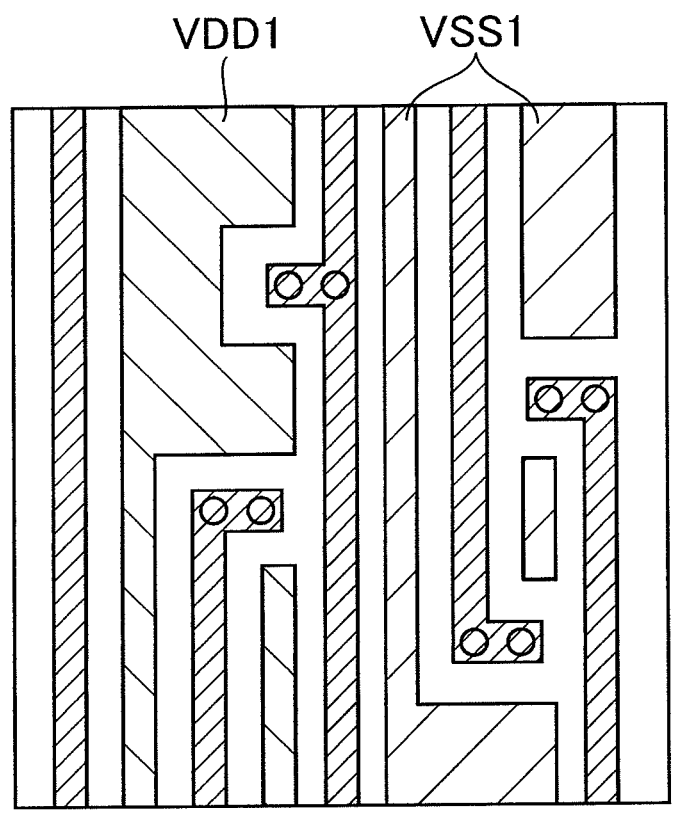
FIG. 14 is a diagram indicative of layout data after step S7 shown in FIG. 9 is completed.

Then, the processing unit 43 defines a plurality of power supply lines VDD1 and VSS1 extending in the Y-direction on the lower wiring layer in such a way that interference in the overlap region OL1 does not occur (Step S7). Furthermore, the processing unit 43 defines a plurality of power supply lines VDD2 and VSS2 extending in the X-direction on the upper wiring layer (Step S8). At step S7, one power supply line VDD1 or VSS1 is defined between two adjacent signal lines; when interference with a signal line occurs in the overlap region OL1, the power supply line VDD1 or VSS1 is divided in the Y-direction to avoid the interference. More specifically, as shown in FIG. 13, regions D and regions S sandwiched between three signal lines are set so as to appear alternately. Power supply lines VDD1 are defined in the regions D, and power supply lines VSS1 in the regions S. Then, as shown in FIG. 14, in order to prevent the power supply lines VDD1 and VSS1 from interfering with the signal lines, i.e. in order to ensure the minimum wiring interval on the lower wiring layer, grooves are made on the power supply lines VDD1 and VSS1. In this manner, pattern data of the power supply lines VDD1 and VSS1 are generated. At step S8, one power supply line VDD2 or VSS2 is defined between two adjacent signal lines.

Subsequently, the processing unit 43 specifies overlap regions OL2 and OL3, in which among power supply lines VDD1 and VSS1 of the lower wiring layer and power supply lines VDD2 and VSS2 of the upper wiring layer, power supply lines to be connected together overlap each other in planar view (Step S9). In the overlap regions OL2 and OL3, via conductors VE2 and VE3 are respectively defined (Step S10). The via conductors VE2 and VE3 are so set as to have minimum diameters, which can be defined in the overlap regions OL2 and OL3.

The above processes generate layout data from wiring data, and the layout data are stored in the data area 41. The layout data stored in the data area 41 are output to the outside via the input/output unit 44 (Step S11), and are used for designing a mask or other tasks in an actual production process. That is, the processing unit 43 is one of the components to execute the layout method of the semiconductor device.

It is apparent that the present invention is not limited to the above embodiments, but may be modified and changed without departing from the scope and spirit of the invention.

For example, in addition to the above-described technical idea (concept), the technical idea can be applied in combination even on the upper wiring layer. In a first overlap region at a first location, power supply lines related to two via conductors extending in an X-direction and are divided in a Y-direction. In a first overlap region at a second location, power supply lines related to two via conductors extending in the Y-direction are divided in the X-direction.

For example, in FIG. 1, VDD1 and VDD2 are at VDD potential, VDDI potential, or VDDQ potential. VSS1 and VSS2 are at VSS potential, VSSI potential or VSSQ potential.

For example, according to the technical idea (concept) of the present invention, a plurality of first power supply lines associated with VDD potential and a plurality of second power supply lines associated with VDDI potential may be combined together. A plurality of third power supply lines' associated with VSS potential and a plurality of fourth power supply lines associated with VSSI potential may be combined together. At this time, needless to say, since the VDD potential and the VDDI potential are for example definitely different, no via conductor is placed for connecting a plurality of power supply lines associated with the VDD potential and VDDI potential. Moreover, a plurality of fifth power supply lines associated with VDDQ potential and a plurality of sixth power supply lines associated with VSSQ potential may be added. It is preferred that a plurality of the first to sixth power supply lines supplied with the potential associated with each of a plurality of signal lines has be adjacent to each other. In the best mode, it is desirable that on both sides of a signal line, two power supply lines supplied with the potential for the signal line are disposed adjacent to the signal line in such a way that the signal line is sandwiched between the power supply lines. The two power supply lines across a signal line may be two power supply lines is supplied with both high or low potential. One of the two power supply lines may be supplied with high potential and the other of the two power supply lines may be supplied with low potential.

The technical idea of the present application can be applied to various wiring regions associated with a plurality of signal lines. Moreover, a layout type disclosed in the drawings, as well as a circuit that generates a signal, is not limited to a circuit type disclosed in an example.

The technical concept of the semiconductor device of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following methods and design programs:

A1. A layout method of a semiconductor device comprising:

defining a plurality of first signal lines each extending in a first direction on a first wiring layer;

defining a plurality of second signal lines each extending in a second direction that crosses the first direction on a second wiring layer;

specifying a plurality of first regions in which the first and second signal lines to be connected together overlap each other in planar view;

expanding a width of the first signal lines in the second direction in the first regions;

defining a first via conductor in each of the expanded first regions;

defining a plurality of first power supply lines extending in the first direction on the first wiring layer in such a way that interference with the first signal lines does not occur in the first regions; and defining a plurality of second power supply lines each extending in the second direction on the second wiring layer.

A2. The layout method of the semiconductor device as A1, further comprising:

specifying a plurality of second regions in which the first and second power supply lines to be connected together overlap each other in planar view; and defining a second via conductor in each of the second regions.

A3. The layout method of the semiconductor device as A2, wherein the second via conductor is so set as to have a minimum diameter that can be defined in each of the second regions.

A4. The layout method of the semiconductor device as A2 or A3, wherein more than one first via conductor having substantially the same diameter as the second via conductor are defined in each of the first regions.

A5. The layout method of the semiconductor device as A2 or A3, wherein the first via conductor whose diameter in the second direction is larger than the diameter in the second direction of the second via conductor is defined in each of the first regions.

A6. The layout method of the semiconductor device as any one of A1 to A5, wherein the defining the plurality of first signal lines includes setting a wiring pitch of the first signal lines at substantially double a wiring pitch that can be defined on the first wiring layer.

A7. The layout method of the semiconductor device as A6, wherein the defining the plurality of first power supply lines includes defining the first power supply lines between adjacent two of the first signal lines.

A8. The layout method of the semiconductor device as A7, wherein the defining the plurality of first power supply lines further includes dividing the first power supply lines in the first direction so as to avoid interference with the first signal lines in the first regions.

A9. The layout method of the semiconductor device as any one of A1 to A8, wherein the defining the plurality of second signal lines includes setting a wiring pitch of the plurality of second signal lines at two or more times as large as a wiring pitch that can be defined on the second wiring layer.

A10. The layout method of the semiconductor device as any one of A1 to A9, wherein the expanding the width of the first signal lines includes displacing a position of the first region in the second direction relative to a central axis in the second direction of the corresponding first signal line.

A11. A design program of a semiconductor device that causes a computer to execute:

a first function of defining a plurality of first signal lines each extending in a first direction on a first wiring layer;

a second function of defining a plurality of second signal lines each extending in a second direction that crosses the first direction on a second wiring layer;

a third function of specifying a plurality of first regions in which the first and second signal lines to be connected together overlap each other in planar view;

a fourth function of expanding a width of the first signal lines in the second direction in the first region;

a fifth function of defining a first via conductor in each of the expanded first regions;

a sixth function of defining a plurality of first power supply lines each extending in the first direction on the first wiring layer in such a way that interference with the first signal lines does not occur in the first region; and a seventh function of defining a plurality of second power supply lines each extending in the second direction on the second wiring layer.

A12. The design program of the semiconductor device as A11, that causes the computer to further execute:

an eighth function of specifying a plurality of second regions in which the first and second power supply lines to be connected together overlap each other in planar view; and a ninth function of defining a second via conductor in each of the second regions.

A13. The design program of the semiconductor device as A12, wherein the ninth function includes a function of setting a diameter of the second via conductor to a minimum diameter that can be defined in each of the second regions.

A14. The design program of the semiconductor device as A12 or A13, wherein the fifth function includes a function of defining more than one first via conductors having substantially the same diameter as the second via conductor in the first region.

A15. The design program of the semiconductor device as A12 or A13, wherein the fifth function includes a function of defining the first via conductor whose diameter in the second direction is larger than the diameter in the second direction of the second via conductor.

A16. The design program of the semiconductor device as any one of A11 to A15, wherein the first function includes a function of setting a wiring pitch of the plurality of first signal lines at substantially double a wiring pitch that can be defined on the first wiring layer.

A17. The design program of the semiconductor device as A16, wherein the sixth function includes a function of defining the first power supply lines between adjacent two of the first signal lines.

A18. The design program of the semiconductor device as A17, wherein the sixth function further includes a function of dividing the first power supply line in the first direction so as to avoid interference with the first signal lines in the first regions.

A19. The design program of the semiconductor device as any one of claims A11 to A18, wherein the second function includes a function of setting a wiring pitch of the plurality of second signal lines at two or more times as large as a wiring pitch that can be defined on the second wiring layer.

A20. The design program of the semiconductor device as any one of A11 to A19, wherein the fourth function includes a function of offsetting a position of the first region in the second direction relative to a central axis in the second direction of the corresponding first signal line.

What is claimed is:

1. A semiconductor device comprising:

a plurality of first conductive lines extending in a first direction formed on a first layer;

a plurality of second conductive lines extending in a second direction different from the first direction formed on a second layer provided above the first layer; and a plurality of via conductors each connecting one of the first conductive lines to an associated one of the second conductive lines, the via conductors being provided on a third layer provided between the first and second layers, wherein each of the via conductors has a circle-shaped or an ellipse-shaped having larger in area than the via conductor of the circle-shaped, the via conductors of the ellipse-shaped having a major axis extending in the second direction, the first conductive lines include a plurality of first signal lines and a plurality of first power supply lines so as to be adjacent to each other, the second conductive lines include a plurality of second signal lines and a plurality of second power supply lines so as to be adjacent to each other, the third layer includes a plurality of first regions, each of the first regions being provided between one of the first signal lines and an associated one of the second signal lines, at least two via conductors of the circle-shaped laid out in the second direction or at least one via conductor of the ellipse-shaped are disposed at each of the first regions, each of the first signal lines has a second region that is overlapped with an associated one of the first regions, at least one of the first power supply lines is divided in the first direction so as not to be connected to an adjacent one of the second regions, each of the second signal lines has a third region that is overlapped with an associated one of the first regions, and each of the first power supply lines is connected to an associated one or more of the second power supply lines by at least one of the via conductors.

2. The semiconductor device as claimed in claim 1, wherein each of the second regions has a central axis in the second direction that is different from a central axis of an associated one of the first signal lines in the second direction.

3. The semiconductor device as claimed in claim 2, wherein
the first and second power supply lines include a plurality of high potential lines and a plurality of low potential lines,
at least one of the high potential lines and the low potential lines are disposed such that a set of n lines appears alternately where n is a natural number.

4. The semiconductor device as claimed in claim 3, wherein the n is equal to 2.

5. The semiconductor device as claimed in claim 4, wherein
one of two high potential lines included in the first power supply lines sandwiching one of the first signal lines is divided so as not to connect the adjacent one of the second regions whereas the other one of the two high potential lines is not divided relative to the adjacent one of the second regions, and
one of two low potential lines included in the first power supply lines sandwiching another one of the first signal lines is divided so as not to connect the adjacent one of the second regions whereas the other one of the two low potential lines is not divided relative to the adjacent one of the second regions.

6. The semiconductor device as claimed in claim 4, wherein,
two of high potential lines included in the first power supply lines sandwiching one of the first signal lines are connected to each other by a conductive line provided at a fourth region in the first layer free from the one of the first signal lines, and
two of low potential lines included in the first power supply lines sandwiching another one of the first signal lines are connected to each other by another conductive line provided at a fifth region in the first layer free from the another one of the first signal lines.

7. The semiconductor device as claimed in claim 6, wherein at least one of the via conductors is disposed so as to overlap with the fourth or fifth region.

8. The semiconductor device as claimed in claim 1, wherein at least one of the second power supply lines has a projecting portion to project in the first direction, the projecting portion being provided at a sixth region in the second layer free from adjacent one of the second signal lines.

9. The semiconductor device as claimed in claim 8, wherein at least one of the via conductors is disposed so as to overlap with the sixth region.

10. A semiconductor device comprising:
a first wiring layer on which a plurality of first signal lines and a plurality of first power supply lines extending in a first direction are provided;
a second wiring layer on which a plurality of second signal lines and a plurality of second power supply lines extending in a second direction crossing the first direction are provided;
an insulating layer provided between the first and second wiring layers;
a plurality of first via conductors penetrating through the insulating layer in first regions, each of the first signal lines and an associated one or more of the second signal lines being connected to each other by at least one of the first via conductors; and
a plurality of second via conductors penetrating through the insulating layer in second regions, each of the first power supply lines and an associated one or more of the second power supply lines being connected to each other by at least one of the second via conductors, wherein
a width of the first signal lines in a second direction at the first regions is larger than a width of the first power supply lines in the second direction at the second regions, and
the first power supply line is divided in the first direction to avoid interference with the first signal lines in the first regions.

11. The semiconductor device as claimed in claim 10, wherein
more than one first via conductors are provided in each of the first regions, and
each of the first via conductors has substantially the same diameter as the second via conductor.

12. The semiconductor device as claimed in claim 10, wherein a diameter in the second direction of the first via conductor is larger than a diameter in the second direction of the second via conductor.

13. The semiconductor device as claimed in claim 11, wherein
each of the first regions has a central axis in the second direction that is different from a central axis of an associated one of the first signal lines in the second direction,
the first signal lines provided at the first regions include a first portion having an end relatively far from the central axis of the associated one of the first signal lines in the second direction and a second portion having an end relatively close to the central axis of the associated one of the first signal lines in the second direction,
each of the first power supply lines is divided in the first direction to avoid adjacent one of the first portion of the first signal lines, and
each of the first power supply lines is not divided in the first direction to avoid adjacent one of the second portion of the first signal lines.

14. The semiconductor device as claimed in claim 11, wherein
the first signal lines and the first power supply lines have the same width in the second direction, and
spaces between adjacent two of the first signal lines or the first power supply lines in the second direction have the same length.

15. The semiconductor device as claimed in claim 14, wherein the line pitch on the second wiring layer in the first direction is larger than that of the first wiring layer in the second direction.

16. The semiconductor device as claimed in claim 15, wherein the width in the first direction of the second region is wider than the width in the first direction of the first region.

17. The semiconductor device as claimed in claim 11, wherein
the first signal lines and the first power supply lines are alternately disposed on the first wiring layer, and
the second signal lines and the second power supply lines are alternately disposed on the second wiring layer.

18. The semiconductor device as claimed in claim 17, wherein
the first power supply lines include a plurality of first high-potential power supply lines and a plurality of first low-potential power supply lines, the second power supply lines include a plurality of second high-potential power supply lines and a plurality of second low-potential power supply lines, and the second via conductors include a plurality of high-potential via conductors that connect the first high-potential power supply lines and the second high-potential power supply lines, and a plurality of low-potential via conductors that connect the first low-potential power supply lines and the second low-potential power supply lines.

19. The semiconductor device as claimed in claim 17, wherein the first power supply lines include a plurality of first high-potential power supply lines and a plurality of first low-potential power supply lines, the second power supply lines include a plurality of second high-potential power supply lines and a plurality of second low-potential power supply lines, one of the first signal lines is sandwiched between adjacent two of the first high-potential power supply lines, and another one of the first signal lines is sandwiched between adjacent two of the first low-potential power supply lines.

20. The semiconductor device as claimed in claim 19, wherein two of the first high-potential power supply lines sandwiching the one of the first signal lines are connected to each other by a conductive line provided at a region in the first wiring layer free from the one of the first signal lines, and two of the low high-potential power supply lines sandwiching the another one of the first signal lines are connected to each other by another conductive line provided at another region in the first wiring layer free from the another one of the first signal lines.

* * * * *